(12) United States Patent
Fjelstad

(10) Patent No.: US 7,943,434 B2
(45) Date of Patent: May 17, 2011

(54) MONOLITHIC MOLDED FLEXIBLE ELECTRONIC ASSEMBLIES WITHOUT SOLDER AND METHODS FOR THEIR MANUFACTURE

(75) Inventor: Joseph Charles Fjelstad, Maple Valley, WA (US)

(73) Assignee: Occam Portfolio LLC, Cupertino, CA (US)

( * ) Notice: Subject to any disclaimer, the term of this patent is extended or adjusted under 35 U.S.C. 154(b) by 24 days.

(21) Appl. No.: 12/405,773

(22) Filed: Mar. 17, 2009

(65) Prior Publication Data

US 2009/0237901 A1    Sep. 24, 2009

Related U.S. Application Data

(63) Continuation-in-part of application No. 12/200,749, filed on Aug. 28, 2008, and a continuation-in-part of application No. 12/187,323, filed on Aug. 6, 2008, and a continuation-in-part of application No. 12/191,544, filed on Aug. 14, 2008, and a continuation-in-part of application No. 12/182,043, filed on Jul. 29, 2008, and a continuation-in-part of application No. 12/170,426, filed on Jul. 9, 2008, and a continuation-in-part of application No. 12/163,870, filed on Jun. 27, 2008, now Pat. No. 7,926,173, and a continuation-in-part of application No. 12/119,287, filed on May 12, 2008.

(60) Provisional application No. 61/075,238, filed on Jun. 24, 2008, provisional application No. 61/039,059, filed on Mar. 24, 2008, provisional application No. 61/038,564, filed on Mar. 21, 2008.

(51) Int. Cl.
*H01L 21/00* (2006.01)
(52) U.S. Cl. ....................................... 438/126; 257/687
(58) Field of Classification Search .................. 257/687; 438/126

See application file for complete search history.

(56) References Cited

U.S. PATENT DOCUMENTS

| | | | |
|---|---|---|---|
| 6,193,493 B1 * | 2/2001 | Steijer et al. .................. | 425/116 |
| 6,291,882 B1 * | 9/2001 | Lin .............................. | 257/729 |

* cited by examiner

*Primary Examiner* — Jarrett J Stark
*Assistant Examiner* — Nicholas Tobergte
(74) *Attorney, Agent, or Firm* — Edward P. Heller, III

(57) ABSTRACT

A method (10) for manufacturing a monolithic molded electronic assembly (12). A mold (14) having first and second mold potions (14*a-b*) that mate to form an interior chamber (16) is provided. The mold has an injection port (22) and channel (24) connecting into the chamber. Electronic parts (30) having electronic contacts (32) are populated onto the second mold portion, to be substantially contained in the chamber. The mold potions are mated together and a liquid insulating molding material (36) is injected through the injection port channel to fill the chamber. The molding material is hardened to a solid, thereby embedding the electronic parts in the molding material as a monolithic sub-assembly (40). The monolithic sub-assembly is removed from the mold and one or more solderless conductive circuits (50) are applied to the electronic contacts of the electronic parts, thereby providing the electronic assembly.

12 Claims, 1 Drawing Sheet

…

Figure 1:
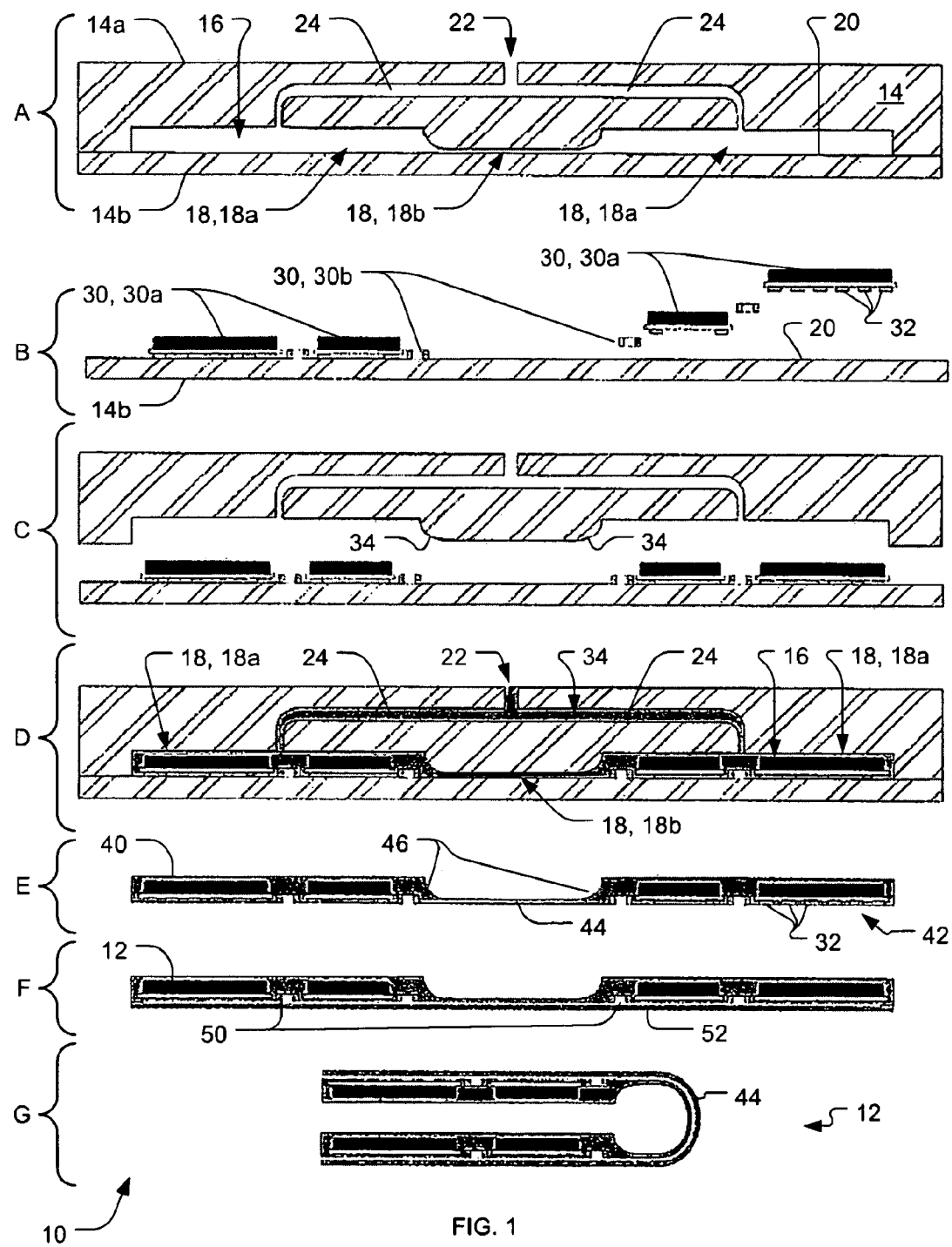

MONOLITHIC MOLDED FLEXIBLE ELECTRONIC ASSEMBLIES WITHOUT SOLDER AND METHODS FOR THEIR MANUFACTURE

CROSS-REFERENCE TO RELATED APPLICATIONS

This application claims the benefit of U.S. Provisional Application No. 61/038,564, filed Mar. 21, 2008; U.S. Provisional Application No. 61/039,059 filed Mar. 24, 2008; and U.S. Provisional Application No. 61/075,238 filed Jun. 24, 2008, hereby incorporated by reference in their entirety.

This application is a continuation-in-part application of pending U.S. patent application Ser. No. 12/119,287, ELECTRONIC ASSEMBLIES WITHOUT SOLDER AND METHODS FOR THEIR MANUFACTURE; U.S. patent application Ser. No. 12/163,870 now U.S. Pat. No. 7,926,173, ELECTRONIC ASSEMBLIES WITHOUT SOLDER AND METHODS FOR THEIR MANUFACTURE; U.S. patent application Ser. No. 12/191,544, ELECTRONIC ASSEMBLIES WITHOUT SOLDER AND METHODS FOR THEIR MANUFACTURE; U.S. patent application Ser. No. 12/170,426, ELECTRONIC ASSEMBLIES WITHOUT SOLDER AND METHODS FOR THEIR MANUFACTURE; U.S. patent application Ser. No. 12/182,043, ASSEMBLY OF ENCAPSULATED ELECTRONIC COMPONENTS TO A PRINTED CIRCUIT BOARD; U.S. patent application Ser. No. 12/187,323 SYSTEM FOR THE MANUFACTURE OF ELECTRONIC ASSEMBLIES WITHOUT SOLDER; and U.S. patent application Ser. No. 12/200,749 ELECTRONIC ASSEMBLIES WITHOUT SOLDER AND METHODS FOR THEIR MANUFACTURE, hereby incorporated by reference in their entirety.

COPYRIGHT NOTICE AND PERMISSION

This document contains some material which is subject to copyright protection. The copyright owner has no objection to the reproduction with proper attribution of authorship and ownership and without alteration by anyone of this material as it appears in the files or records of the Patent and Trademark Office, but otherwise reserves all rights whatsoever.

BACKGROUND OF THE INVENTION

1. Technical Field

The present invention relates to the field of electronic assembly and more specifically to the manufacture and assembly of flexible circuits by molding and plating of electrical and electronic interconnections without the use of solder.

2. Background Art

The assembly of flexible circuits, and more specifically the permanent assembly of package IC components and discrete electronic components (e.g., chip resistors, chip capacitors, diodes, etc.) to the outer surfaces of flexible circuit boards, has involved the use of some form of relatively low temperature solder alloy (e.g., Sn63Fb37) since the earliest days of the electronics industry. The reasons for using solder assembly are numerous, but can be summarized by noting here that it has long served well to allow for the mass joining of thousand of electronics interconnections between printed circuits (rigid or flexible) and the leads of electronic components.

While solder alloys have been most common, other joining materials have been proposed and/or used, including isotropic and anisotropic adhesives or so-called "polymer solders" which are a form of conductive adhesive. In some cases even non-conductive adhesives have also been suggested. Moreover, there have been efforts to make connections separable by providing sockets for components, to facilitate removal and replacement if needed or desired. In addition, there have also been electrical and electronic connectors developed to link power and signal carrying conductors with various resilient contact structures, but all of which require constant applied force or pressure.

Adhesive and socket solutions are attractive for some applications because they do not require exposing components mounted on them to high temperatures, however, each of these solutions also has limitations related to cost, performance, reliability, and combinations thereof. Current generation adhesives are not as conductive as electronic solder and sockets, while they allow for easy component removal and replacement. They also add unwanted weight and are expensive.

In recent years the electronics industry has been forced by European Union legislation to eliminate the element lead (Pb) from solder, based on a presumption of risk to humans which has yet to be proven. However, the impact of this legislation has been deleterious to the electronics industry as electronic assemblies are less reliable because of the higher temperatures required. In addition, the energy used to obtain the higher temperatures has been damaging to the environment. Present day technical and trade journals for the electronics industry are replete with articles and technical papers describing problems associated with lead-free soldering and research into ways to make the problem less onerous. The high temperatures of soldering significantly reduce the number of options available for use as a prospective substrate and tend to force the user to employ higher temperature materials.

Given the aforementioned problems in the assembly of flexible circuits with solder, especially for lead-free solders, there is room for further improvement in flexible circuit assembly technology.

BRIEF SUMMARY OF THE INVENTION

Accordingly, it is an object of the present invention to provide improved electronic assemblies, especially electronic assemblies designed to be flexed for installation or in use.

And it is a further object of the present invention to provide improved methods for manufacturing of such electronic assemblies.

Briefly, one preferred embodiment of the present invention is a method for the manufacture of a monolithic molded electronic assembly. A mold is provided that has a first mold portion and a second mold potion that mate together to form an interior chamber, wherein the mold has an injection port that connects into an injection channel that connects into the chamber. A plurality of electronic parts that have electronic contacts are populated onto the second mold portion, such that the electronic parts will be substantially contained in the chamber. The first and the second mold potions are then mated together and an insulating molding material in a liquid state is injected into the injection port and through the injection channel to fill the chamber. The molding material is hardened from the liquid state to a solid state, thereby embedding the plurality of electronic parts in the molding material as a monolithic sub-assembly. The monolithic sub-assembly is removed from the mold and one or more solderless conductive circuits are applied to the electronic contacts of the electronic parts, thereby providing the monolithic molded electronic assembly.

Briefly, another preferred embodiment of the present invention is an article of manufacture made by the method described in the preceding paragraph.

And briefly, another preferred embodiment of the present invention is a circuit assembly. The circuit assembly includes a plurality of electronic parts that have electronic contacts. The electronic parts are over molded with a flexible-hardening insulating molding material to a first thickness, to have areas between sub-pluralities of the electronic parts having a different second thickness thereby forming a monolithic sub-assembly. And the monolithic sub-assembly has at least one solderless layer of conductive circuits interconnecting the electronic contacts of the electronic parts.

These and other objects and advantages of the present invention will become clear to those skilled in the art in view of the description of the best presently known mode of carrying out the invention and the industrial applicability of the preferred embodiment as described herein and as illustrated in the figures of the drawings.

BRIEF DESCRIPTION OF THE SEVERAL VIEWS OF THE DRAWING(S)

The purposes and advantages of the present invention will be apparent from the following detailed description in conjunction with the appended figures of drawings in which:

FIG. 1 depicts a representative assembly method used in accord with the present invention to produce an electronic circuit assembly.

In the various figures of the drawings, like references are used to denote like or similar elements or steps.

DETAILED DESCRIPTION OF THE INVENTION

A preferred embodiment of the present invention is a method for the manufacture of monolithic molded electronic assemblies without solder having integral sections which are disposed for flexing when the assembly is complete. This is illustrated in the various drawings herein, and particularly in the view(s) of FIG. 1, wherein the embodiment of the invention are depicted by the general reference character 10.

In the following description and in the accompanying drawings, specific terminology and drawing symbols are set forth to provide a thorough understanding of the present invention. In some instances, the terminology and symbols may imply specific details that are not required to practice the invention. For example, the interconnection between conductor elements of components (i.e., component I/O leads or terminals) may be shown or described as having multi-conductors interconnecting to a single lead or a single conductor signal line connected to multiple component contacts within or between devices. Thus, each of the multi-conductor interconnections may alternatively be a single-conductor signaling, control, power, or ground line and vice versa. Any circuit paths described as being single-ended may also be differential, and vice-versa. The interconnected assembly may be comprised of standard interconnections, microstrip or strip-line interconnections and all signal lines of the assembly may be either shielded or unshielded.

FIG. 1 provides an example of an assembly method 10 used in accord with the present invention to produce an electronic circuit assembly 12.

In a step A, a mold 14 is provided which has a first mold portion 14a and a second mold portion 14b. [N.b., to simplify presentation of the inventive principles here the mold portions are depicted as two portions, specifically top and bottom ones. It should be appreciated, however, that alternate embodiments of the inventive assembly method 10 may employ molds 14 having more then two portions and that orientation as "top" or "bottom" portions is not a requirement.]

When mated together, the first mold portion 14a and the second mold portion 14b form an interior chamber 16 inside the mold 14. This chamber 16 is characterized by having at least two sets of sub-regions 18. The chamber 16 shown has two identical thick sub-regions 18a and one thin sub-region 18b. Of course, in straightforward manner and as will become clear as this discussion proceeds, alternate embodiments of chambers 16 in accord with this invention may have only a single thick region, say if the electronic assembly requires little flexibility, and yet other embodiments may have a larger number of different sets of sub-regions, say, ones for particularly thick electronic parts, others for various less thick electronic parts, yet others where no electronic parts are placed, and even others where minimal thickness is needed (e.g., for maximum flexibility).

Continuing still in step A, the chamber 16 also has at least one contact wall section 20. In FIG. 1 the mold 14 shown has only one contact wall section 20 and it is flat and at the bottom of the chamber 16 (i.e., on the second mold portion 14b), but alternate embodiments may have more than one contact wall section on one mold portion or may have one or more contact wall sections on "other" sides of the chamber 16.

The first mold portion 14a has at least one injection port 22 for receiving a liquid mold material, and each such injection port 22 connects to one or more injection channels 24 that are suitable for the liquid mold material to flow through into the chamber 16. Additionally and optionally, the mold 14 may have one or more relief ports (not shown) to allow air (or another ambient gas present during molding) as well as excess liquid mold material to escape. Alternately, the mold portions 14a, 14b may be loosely mated during molding and thus allow air or gas and excess mold material to escape. [N.b., by analogy particularly to traditional sand casting, the mold 14 as a whole is analogous to a "pattern," the first mold portion 14a is analogous to a "cope," the second mold portion 14b is analogous to a "drag," the injection port 22 is analogous to a "sprue" or injection ports 22 are analogous to "runners," and any relief ports are analogous to "risers."]

The second mold portion 14b and the contact wall section 20 are depicted here as flat, but this is merely coincidental with the use of this particular example, and is not a limitation.

In a step B the second mold portion 14b at the contact wall section 20 is populated with electronic parts 30, such as the depicted IC packages 30a and discrete components 30b (e.g., resistors, capacitors, and inductors or RF coils). The electronic parts 30 are preferably packaged IC's, fully tested and burned-in, and are quality assured discrete components to assure their long term reliability in the circuit assembly 12 in use. In the embodiment depicted in FIG. 1, gravity may be adequate to hold the electronic parts 30 in place. In other embodiments, however, a more affirmative mechanism may be needed to hold the electronic parts 30 in place, if the contact wall section 20 is not horizontally flat or if rapid injection of a molding material might move some of the electronic parts 30. Then an adhesive or equivalent mechanism may be used to retain the electronic parts 30 in place.

Of course, other parts than those shown can also be employed, and these might include connectors, sockets and other interconnection devices of that sort. In the example here, the electronic parts 30 are shown placed entirely inside what will be the chamber 16 when the mold 14 is closed, but this also is not an absolute requirement. For example, one end or a ribbon cable might be placed inside the chamber 16, in the manner of the other electronic parts 30, while the other end of this ribbon cable might protrude from the mold 14. The end of the ribbon cable then will also protrude from the finished circuit assembly 12, in one embodiment, to permit electrical connection of the circuit assembly 12 into another electronic assembly.

Continuing still in step B, the electronic parts inherently have electronic contacts 32 (or terminals or pads) and these, for reasons that will become clear presently, are usually arranged to be against a contact wall section 20 of the chamber 16.

In a step C, the first mold portion 14a is about to be mated with the now parts-populated second mold portion 14b. In general, step C is straightforward, but depicting it here serves to show an optional feature of the mold 14. For flexibility and robustness of the finished circuit assembly 12, optional transition radiuses 34 can be provided in the mold 14 at some of the edges of the sub-regions 18, as shown. In addition to facilitating the flow of a liquid mold material, these can particularly provide strain gradients in the ultimate circuit assembly 12 being produced here.

In a step D, the first mold portion 14a and the second mold portion 14b have been mated, and an insulating molding material 36 in a liquid state has been injected into the injection port 22, through the injection channels 24, and has filled the chamber 16 in the mold 14.

In a step E, the molding material 36 which was in a liquid state has now been hardened to a solid state, thus embedding the electronic parts 30 in the molding material 36 and forming a monolithic sub-assembly 40 that is shown here removed from the mold 14. In particular, it can be seen here that this monolithic sub-assembly 40 has thick areas corresponding with the thick sub-regions 18a of the chamber 16 in the mold 14, a thin area 44 corresponding with the thin sub-region 18b, and that the electronic contacts 32 of the electronic parts 30 that were abutting the contact wall section 20 of the mold 14 are now exposed at a contact face 42. Additionally, this monolithic sub-assembly 40 has material radiuses 46 that correspond with the transition radiuses 34 in the mold 14.

In a step F, one or more conductive circuits 50 are formed on to the contact face 42 of the monolithic sub-assembly 40, thus making electrical connections as needed between the electronic contacts 32 of the various electronic parts 30. These conductive circuits 50 can be made by any of a number of different processes, including plating and direct connection with conductive inks or catalytic inks which can later be metalized using an electroless or electrolytic plating process or combinations of any or all of these. Notably, the process used here can be a solderless one, with all of the advantages that it entails, and in fact, while a solder based process might still be used here, there is no practical benefit.

Additionally, an optional insulating cover 52 is installed here over part or all of the exposed surface of the conductive circuits 50. This insulating cover 52 layer can similarly be applied by any suitable means, for example, screen printing, photo imaging, or direct printing. While only one layer of conductive circuits 50 and one layer of insulating cover 52 are shown for brevity here, multiple layers of both can be applied as desired to create more complex circuit assemblies. At this point, the monolithic sub-assembly 40 has been completed into the desired circuit assembly 12.

Finally, although actual fabrication of the circuit assembly 12 was completed in step F, manipulating the circuit assembly 12 for the end application still remains. Accordingly, in a step G the circuit assembly 12 is formed into shape as needed. From FIG. 1 here it can particularly be seen how some areas of the circuit assembly 12 are rigid while others are flexible, as well as how the material radiuses 28 facilitate this and make the circuit assembly 12 more robust.

While various embodiments have been described above, it should be understood that they have been presented by way of example only, and that the breadth and scope of the invention should not be limited by any of the above described exemplary embodiments, but should instead be defined only in accordance with the following claims and their equivalents.

What is claimed is:

1. A method (10) for the manufacture of a monolithic molded electronic assembly (12), the method comprising the steps of:
   (a) providing a mold (14) having a first mold portion (14a) and a second mold potion (14b) that mate together to form an interior chamber (16), wherein said mold (14) has an injection port (22) that connects into an injection channel (24) that connects into said chamber (16);
   (b) populating onto said second mold portion (14b) a plurality of electronic parts (30) that have electronic contacts (32), such that said plurality of electronic parts (30) will be substantially contained in said chamber (16);
   (c) mating said first mold portion (14a) and said second mold potion (14b) together;
   (d) injecting an insulating molding material (36) in a liquid state into said injection port (22) and through said injection channel (24) to fill said chamber (16);
   (e) hardening said molding material (36) from said liquid state to a solid state, thereby embedding said plurality of electronic parts (30) in said molding material as a monolithic sub-assembly (40);
   (f) removing said monolithic sub-assembly (40) from said mold (14); and
   (g) applying one or more solderless conductive circuits (50) to said electronic contacts (32) of said electronic parts (30), thereby providing the monolithic molded electronic assembly (12);
   wherein:
   said chamber (16) has two or more sub-regions (18) that include a thin sub-region (18b) characterized by a minimal separation in said chamber (16) between said first mold portion (14a) and said second mold potion (14b) when mated together; and
   said monolithic sub-assembly (40) has a thin area (44) corresponding with said thin sub-region (18b) of said chamber (16).

2. The method of claim 1, wherein said electronic parts (30) are burned in prior to said step (b).

3. The method of claim 1, wherein said electronic parts (30) are pre-tested prior to said step (b).

4. The method of claim 1, wherein:
   said two or more sub-regions (18) further include a thick sub-region (18a) characterized by a greater separation in said chamber (16) than for said thin sub-region (18b); and said mold (14) has one or more transition radiuses (34) between a said thick sub-region (18a) and a said thin sub-region (18b).

5. The method of claim 1, wherein:
   none of said electronic parts (30) are contained in said thin sub-region (18b).

6. The method of claim 1, wherein:
   said second mold portion (14b) has a contact wall section (20) at said chamber (16);
   said step (b) includes abutting said electronic contacts (32) of said plurality of electronic parts (30) against a said contact wall section (20) such that in said step (e) said monolithic sub-assembly (40) has a contact face (42) where said electronic contacts (32) are exposed; and, said step (g) includes applying at least one of said one or more solderless conductive circuits (50) to said contact face (42) of said monolithic sub-assembly (40).

7. The method of claim 6, wherein said contact wall section (20) is flat.

8. The method of claim 6, wherein:
said chamber (16) has a plurality of said contact wall sections (20);
said step (b) includes abutting said electronic contacts (32) of said plurality of electronic parts (30) against one of said plurality of said contact wall sections (20) such that in said step (e) said monolithic sub-assembly (40) has a plurality of said contact faces (42) where said electronic contacts (32) are exposed; and,
said step (g) includes applying at least one of said one or more solderless conductive circuits (50) to each of said plurality of said contact faces (42) of said monolithic sub-assembly (40).

9. The method of claim 1, wherein:
said step (g) includes a process that is a member of the set consisting of plating, direct connection with a conductive or catalytic ink which is metalized using an electroless or electrolytic plating process, or a combination of any or all of these.

10. The method of claim 1, further comprising:
(h) installing an insulating cover (52) over all or part of said conductive circuits (50).

11. The method of claim 10, wherein:
said step (h) includes a process that is a member of the set consisting of screen printing, photo imaging, and direct printing.

12. The method of claim 10, further comprising:
employing a plurality of sequential instances of said step (g) and said step (h).

\* \* \* \* \*